(12) United States Patent
Beebe (10) Patent No.: US 7,165,566 B2
(45) Date of Patent: Jan. 23, 2007

(54) METHOD OF FORMING A MICROSTRUCTURE USING MASKLESS LITHOGRAPHY

(75) Inventor: David J. Beebe, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 423 days.

(21) Appl. No.: 10/422,237

(22) Filed: Apr. 24, 2003

(65) Prior Publication Data

US 2004/0055655 A1 Mar. 25, 2004

Related U.S. Application Data

(60) Provisional application No. 60/374,950, filed on Apr. 24, 2002.

(51) Int. Cl.
*H01L 21/311* (2006.01)
(52) U.S. Cl. .................. 137/15.01; 137/828; 438/694; 438/700
(58) Field of Classification Search ............... 137/828, 137/15.01; 438/694, 700
See application file for complete search history.

(56) References Cited

U.S. PATENT DOCUMENTS

| 6,167,910 | B1 | 1/2001 | Chow ..................... 137/827 |
| 6,200,646 | B1* | 3/2001 | Neckers et al. ............ 427/510 |
| 6,208,087 | B1 | 3/2001 | Hughes et al. ............. 315/291 |
| 6,271,957 | B1 | 8/2001 | Quate et al. .............. 359/298 |
| 6,488,872 | B1* | 12/2002 | Beebe et al. ................ 264/31 |
| 6,821,898 | B2* | 11/2004 | Beebe et al. ............... 438/694 |
| 2002/0122881 | A1* | 9/2002 | Kaeriyama et al. ........... 427/58 |
| 2004/0084811 | A1* | 5/2004 | Beebe et al. ............... 264/401 |

\* cited by examiner

*Primary Examiner*—A. Michael Chambers
(74) *Attorney, Agent, or Firm*—Boyle Fredrickson Newholm Stein & Gratz S.C.

(57) ABSTRACT

A method is provided for fabricating a microstructure using maskless lithography. A first layer is provided in a spaced relationship to a base layer so as to define a construction cavity therebetween. The first layer has a passageway therethrough that communicates with the construction cavity. The construction cavity is filled with material and a polymerizing agent is directed towards a portion of the material so as to polymerize the same. The polymerized material defines a channel network and the non-polymerized material is flushed from the channel network.

19 Claims, 8 Drawing Sheets

METHOD OF FORMING A MICROSTRUCTURE USING MASKLESS LITHOGRAPHY

CROSS-REFERENCE TO RELATED APPLICATIONS

This application claims the benefit of U.S. Provisional Application Ser. No. 60/374,950, filed Apr. 24, 2002.

REFERENCE TO GOVERNMENT GRANT

This invention was made with United States government support awarded by the following agencies: DOD AF30602-00-2-0570. The United States has certain rights in this invention.

FIELD OF THE INVENTION

This invention relates generally to microfluidic devices, and in particular, to a method of forming a microstructure using liquid phase, photo-polymerizable materials and maskless lithography.

BACKGROUND AND SUMMARY OF THE INVENTION

As is known, microfluidic systems are being used in an increasing number of applications. However, further expansion of the uses for such microfluidic devices has been limited due to the difficulty and expense of fabrication. By way of example, Chow, U.S. Pat. No. 6,167,910 discloses a multi-layer microfluidic device and method of making the same. The microfluidic device disclosed in the Chow '910 patent includes a body structure having a plurality of substrate layers such as a bottom substrate, a middle substrate and a top substrate. The bottom substrate includes a top surface having grooves fabricated therein in any conventional manner, such as by etching or the like. Upon the mating of the top surface of the bottom substrate with the bottom surface of the middle substrate, these grooves form a channel network for the microfluidic device. Additional channel networks may be formed by the top surface of another substrate and the bottom surface of the adjacent substrate. In such manner, multi-layer channel networks may be formed within a microfluidic device. Ports may be provided in each of the substrates to interconnect the various channel networks within the microfluidic device. It is contemplated to thermally bond the substrates together in order to form an integral, microfludic device.

While the method disclosed in the Chow '910 patent is functional for its intended purpose, the method disclosed therein has significant limitations. By way of example, each of the substrates must be preformed using traditional microfabrication methods that involve etching. These traditional methods are inherently expensive due to the equipment, materials and process complexity issues required. Further, the cost of thermally bonding the substrates together in high temperature annealing ovens increases the overall cost to manufacture the microfluidic device. As such, it is highly desirable to provide a simpler and more economical method of fabricating microfluidic devices.

Therefore, it is a primary object and feature of the present invention to provide a method of fabricating a microstructure that is simple and inexpensive.

It is a further object and feature of the present invention to provide a method of fabricating a microstructure that may be performed more quickly than prior methods of fabrication.

It is a still further object and feature of the present invention to provide a method of fabricating a microstructure that allows for customization of the microstructure to be fabricated without undue additional expense.

In accordance with the present invention, a method is provided for fabricating a microstructure including a base layer having an upper surface. The method includes the step of providing a first layer having upper and lower surfaces. The lower surface of the first layer is in a spaced relationship to the upper surface of the base layer such that the lower surface of the first layer and the upper surface of the base layer define a construction cavity therebetween. The first layer has a passageway therethrough that communicates with the construction cavity. The construction cavity is filled with material and a polymerizing agent is directed towards a portion of the material within the construction cavity of outside the channel to be formed therein such that the portion of the material is polymerized. The material within the channel is flushed therefrom.

The first layer may include a fill hole therethrough to allow for the filling of the construction cavity. In addition, the passageway communicates with the channel. The passageway may be plugged to prevent material from flowing therein during filling. It is contemplated to provide a gasket about the construction cavity to maintain the material therein during filling.

A second layer may be provided having upper and lower surfaces and being in a spaced relationship to the first layer such that the lower surface of the second layer and the upper surface of the first layer define a second construction cavity therebetween. The second layer has a passageway therethrough that communicates with the second construction cavity. The second construction cavity is filled with material. A polymerizing agent is directed towards a portion of the material within the second construction cavity such that the portion of the material is polymerized. The material is flushed from the channel in the second construction cavity.

The passageway through the second layer and the passageway through the first layer are axially aligned and communicate with each other through the channel in the second construction cavity. The passageway in the first layer may be plugged to prevent the material from flowing therein during the step of filling the second construction cavity with material. Thereafter, the passageway in the first layer is cleared after a portion of the material is polymerized within the second construction cavity such that the channel in the first construction cavity and the channel in the second construction cavity communicate through the passageway in the first layer. The passageway through the second layer communicates with the upper surface of the second layer through an opening. The method of the present invention may include the additional step of closing the opening.

It is contemplated that the passageway through the first layer communicate with the channel in the first construction cavity and with the channel in the second construction cavity. The first layer includes a second passageway therethrough that communicates with the channel in the construction cavity. The passageway in the second layer communicates with the channel in the second construction cavity and with the upper surface of the second layer through a first opening. The second layer includes a second passageway therethrough that communicates with the second passageway through the first layer and with the upper surface of the second layer through a second opening. One of the openings in the second layer comprises an input and the other of the openings comprises an output to the microfluidic device.

In accordance with a further aspect of the present invention, a method is provided for forming a microstructure. The method includes the steps of providing a material in an area and directing a polymerizing agent towards a portion of the material within the area so as to polymerize the same. By way of example, the microstructure may include a base layer having an upper surface. As such, the method would include the step of providing a first layer having upper and lower surfaces. The lower surface is in a spaced relationship to the upper surface of the base layer such that the lower surface of the first layer and the upper surface of the base layer define a construction cavity therebetween. The construction cavity is filled with material and the polymerizing agent is direct towards a portion of the material within the construction cavity so as it will polymerize the same.

The polymerized material defines a first channel within the microstructure device. The material in the first channel is flushed therefrom. The step of directing the polymerizing agent towards the portion of the material includes the step of generating ultraviolet radiation with a source. The ultraviolet radiation is directed towards the portion of material to be polymerized.

It is contemplated to provide a second layer having upper and lower surfaces. The second layer is spaced from the first layer such that the lower surface of the second layer and the upper surface of the first layer define a second construction cavity therebetween. The second construction cavity is filled with the material and a portion of the material is polymerized so as to polymerize the same. The solidified material defines a second channel in the microstructure. A first passageway is provided through the first layer that communicates with the first and second channels. A second passageway is provided through the first layer that communicates with the first channel. A first passageway is provided in the second layer that communicates with the second channel and with the upper surface of the second layer through a first opening. In addition, a second passageway is provided through the second layer that communicates with the second passageway through the first layer and with the upper surface of the second layer through a second opening. One of the openings in the second layer comprises as an input and the other of the openings comprises an output to the microstructure.

In accordance with a further aspect of the present invention, a method is provided for constructing a microstructure. The method includes the steps of injecting a fluidic material into a construction cavity and directing a polymerizing agent towards a portion of the fluidic material within the construction cavity so as to polymerize the same. Thereafter, the non-polymerized, fluidic material is flushed from the construction cavity.

The polymerized material defines a channel network in the microstructure device and the non-polymerized, fluidic material is flushed from the channel network. The step of polymerizing the portion of the fluidic material includes the additional steps of generating ultraviolet radiation with a source and directing the ultraviolet radiation towards the portion of material to be polymerized. It is contemplated that the ultraviolet radiation is ultraviolet light and the ultraviolet light is directed towards the portion of material by an array of micromirrors. The method may also include the additional steps of injecting a fluidic material into a second construction cavity and directing a polymerizing agent towards a portion of the fluidic material within the second construction cavity so as to polymerize the same. Thereafter, the fluidic material is flushed from the second construction cavity.

BRIEF DESCRIPTION OF THE DRAWINGS

The drawings furnished herewith illustrate a preferred methodology of the present invention in which the above advantages and features are clearly disclosed as well as others which will be readily understood from the following description of the illustrated embodiment.

In the drawings.

DETAILED DESCRIPTION OF THE DRAWINGS

Referring to FIGS. 17–21, a microfluidic device fabricated in accordance with the methodology of the present invention is generally designated by the reference numeral 10. It is intended that microfluidic device 10 include a plurality of layers having one or more corresponding channel networks therebetween, as hereinafter described. By way of example, referring to FIGS. 1–2, microfluidic device 10 includes a first layer 16 positioned on upper surface 12 of a base layer 14, such as a microscope slide. It can be appreciated that first layer 16 may be positioned on any substrate, such as a silicon wafer or printed circuited board, without deviating from the scope of the present invention, in order to allow microfluidic device 10 to be operatively connected to such substrate if so desired by the user. Alternatively, microfluidic device 10 may be preformed as a cartridge wherein first layer 16 and base layer 14 are integrally molded so as to define a cavity therebetween, for reasons hereinafter described.

Figure 1:
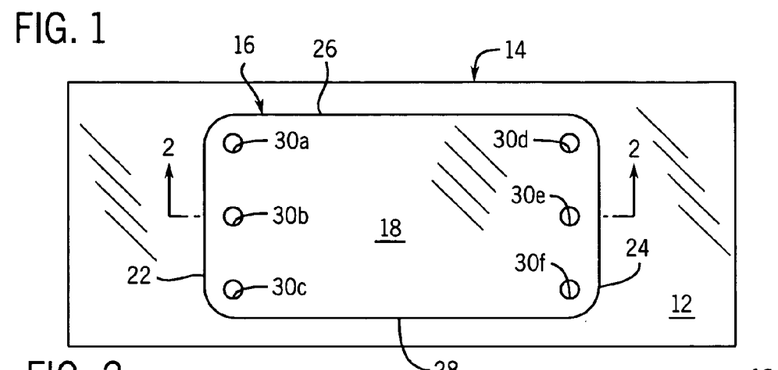
FIG. 1 is a top plan view of a microfluidic device to be constructed in accordance with the present invention.
Figure 2:
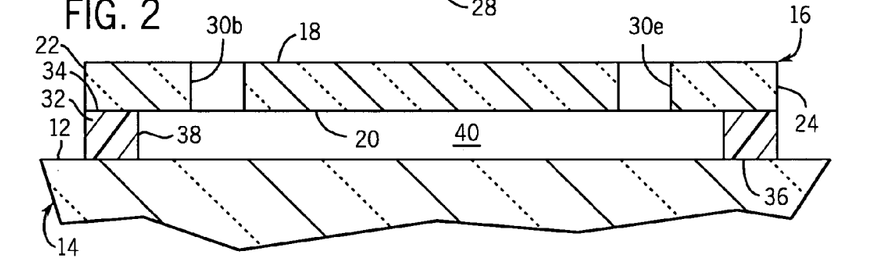
FIG. 2 is a cross-sectional view of the microfluidic device taken along line 2—2 of FIG. 1.

First layer 16 is formed from a polymeric material and includes upper and lower surfaces 18 and 20, respectively, interconnected by first and second ends 22 and 24, respectively, and first and second sides 26 and 28, respectively. A plurality of holes 30a–30f extend through first layer 16 and communicate with upper and lower surfaces 18 and 20, respectively, thereof.

Figure 3:
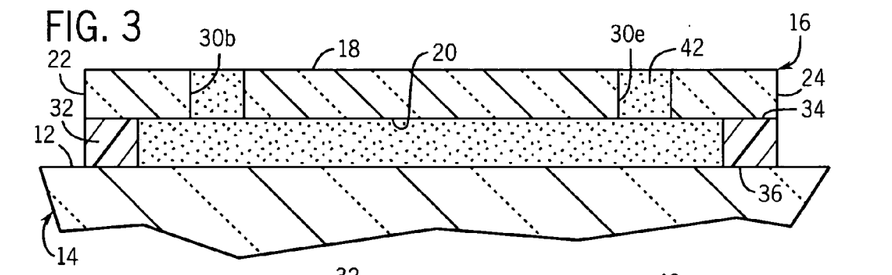
FIG. 3 is a cross-sectional view, similar to FIG. 2, showing a cavity defined by the microfluidic device filled with a polymerizable material.

Gasket 32 includes an upper surface 34 affixed to lower surface 20 of first layer 16 adjacent the outer periphery thereof. Lower surface 36 of gasket 32 is affixed to upper surface 12 of base layer 14. As assembled, inner surface 38 of gasket 32, lower surface 20 of first layer 16 and upper surface 12 of base layer 14 define a cavity 40 for receiving polymerizable material 42 therein, FIG. 3. Polymerizable material 42 solidifies in response to exposure to a polymerizable stimulus such as temperature or ultraviolet light. Polymerizable material 42 is injected into cavity 40 through any one of the openings 30a–30f through the first layer 16.

Referring to FIGS. 4–7, it is intended to form a channel network 46 in cavity 40, as hereinafter described, having a user desired configuration depicted in phantom and generally designated by the reference numeral 44. By way of example, channel network 46 may be generally Y-shaped and includes a base portion 48 having first and second legs 50 and 52, respectively, diverging from first end 48a thereof. It is intended that terminal ends 50a, 52a and 48b of channel network 46 communicate with corresponding openings 30a, 30c, and 30e, respectively, in first layer 16 and that such openings remain open after polymerization of material 42.

Figure 5:
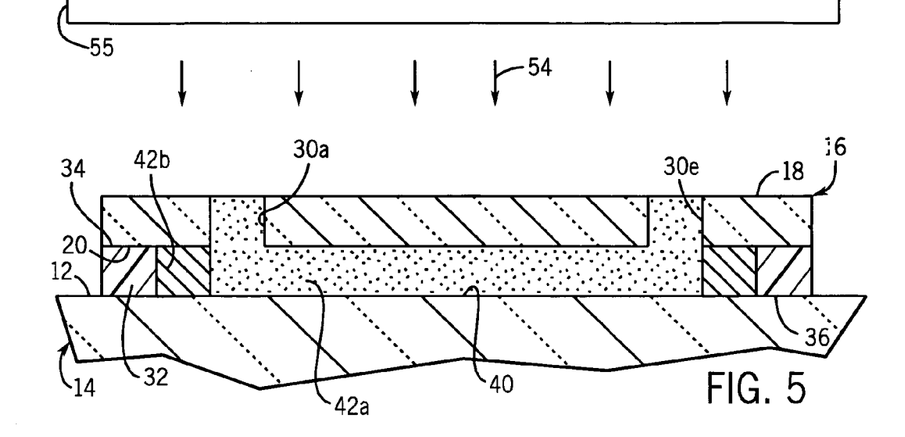
FIG. 5 is a cross-sectional view of the microfluidic device taken along line 5—5 of FIG. 4 showing the polymerization thereof.
Figure 6:
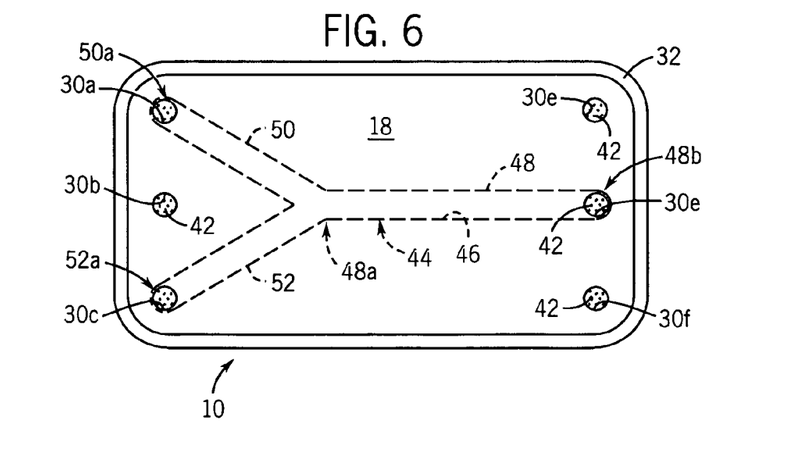
FIG. 6 is a top plan view of the microfluidic device showing the polymerization thereof.

Referring to FIGS. 5 and 6, ultraviolet light, generally designated by the reference numbers 54, is generated by an ultraviolet light projector 55 and is directed towards microfluidic device 10 at an angle generally perpendicular to upper surface 18 of first layer 16. Ultraviolet light projector 55 includes a digital micromirror device that utilizes an array of controllable digital micromirrors to selectively reflect light in pixel units. As a result, the shape and the characteristics of the ultraviolet light 54 emanating from ultraviolet light projector 55 may be programmed in such a manner as to control the patterning of ultraviolet light 54 directed towards microfluidic device 10.

Figure 4:
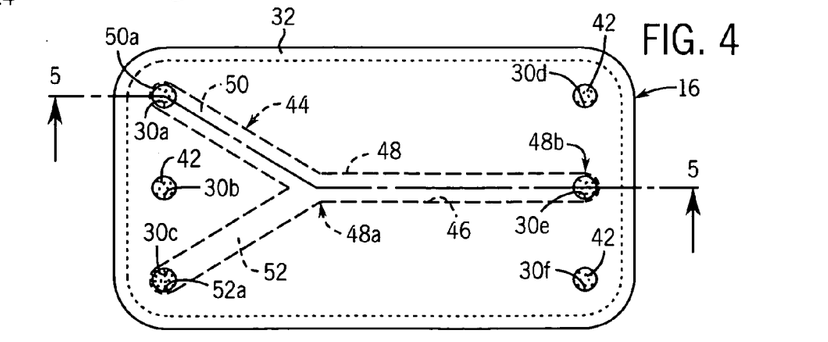
FIG. 4 is a top plan view of the microfluidic device prior to the polymerization thereof.

By way of example, polymerizable material 42 polymerizes and solidifies when exposed to ultraviolet light 54. It can be appreciated that ultraviolet light projector 55 may be programmed such that the ultraviolet light 54 generated thereby forms a pattern on upper surface 18 of first layer 16 wherein the portion 44 of microfluidic device 10 depicted in phantom in FIGS. 4 and 6 is free of ultraviolet radiation. As such, first portion 42a of the polymerizable material 42 is isolated from ultraviolet light 54 and the entire portion of microfluidic device 10 outside of portion 44, depicted in phantom, is exposed to the ultraviolet radiation. Hence, second portion 42b of material 42 is in the path of ultraviolet light 54 and is exposed thereto. Ultraviolet light 54 polymerizes and solidifies the second portion 42a of material 42 in a conventional manner. On the other hand, first portion 42a of material 42 that is isolated from ultraviolet light 54 does not polymerize and remains in a fluidic state. In such manner, it is intended that solidified portion 42b of material 42 define channel network 46 within microfluidic device 10.

Figure 7:
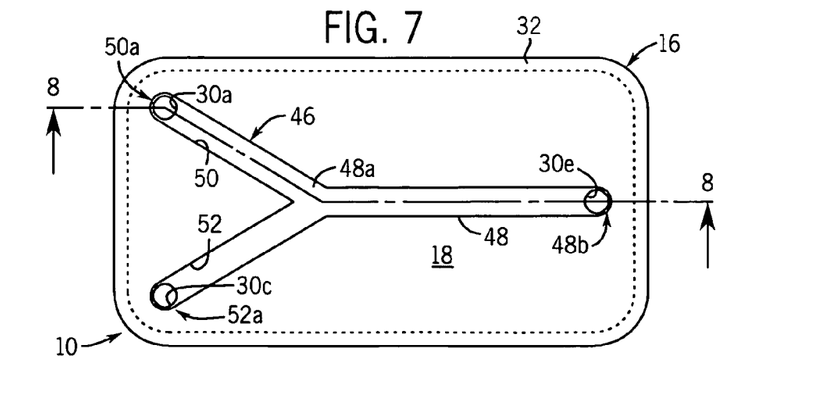
FIG. 7 is a top plan view of the microfluidic device after the polymerization thereof.
Figure 8:
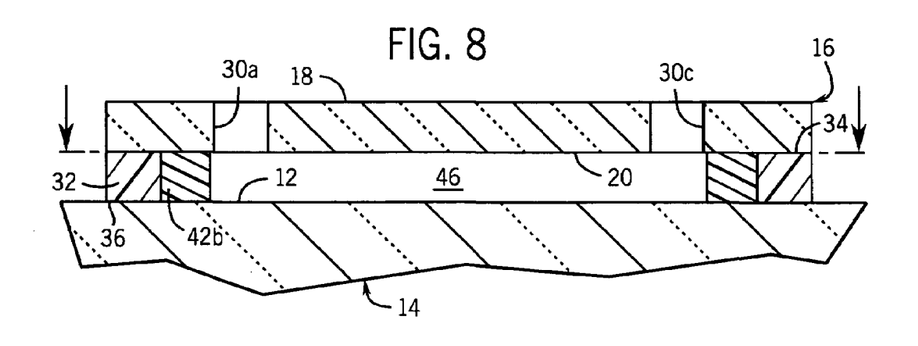
FIG. 8 is a cross-sectional view of the first layer of the microfluidic device after flushing the polymerizable material from the channel network thereof.

Referring to FIGS. 7 and 8, after polymerization of second portion 42b of material 42 by ultraviolet light 54, the non-polymerized portion 42a of the material is flushed from channel network 46 and openings 30a, 30c and 30e in first layer 16. It can be appreciated that channel network 46 has a generally Y-shape that corresponds to the desired shape thereof. As desired, channel network 46 includes base portion 48 having first and second legs 50 and 52, respectively, diverging from first end 48a thereof. Terminal ends 50a, 52a and 48b of channel network 46 communicate with corresponding openings 30a, 30c, and 30e, respectively, in first layer 16

Figure 9:
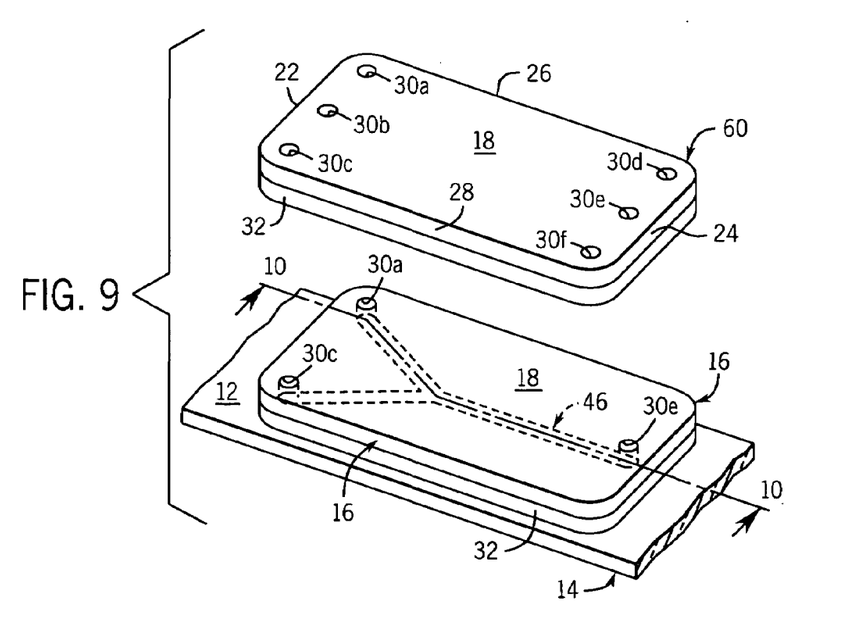
FIG. 9 is an expanded, isometric view showing further construction of the microfluidic device.

Referring to FIG. 9, in order to form a multi-layer microfluidic device, second layer 60 is positioned on upper surface 18 of first layer 16. It can be appreciated that second layer 60 is identical in structure to first layer 16, and as such, the previous description of first layer 16 is understood to describe second layer 60 as if fully described herein. In order to facilitate understanding, common reference characters are used hereinafter to refer to the common components of first layer 16 and second layer 60.

Figure 10:
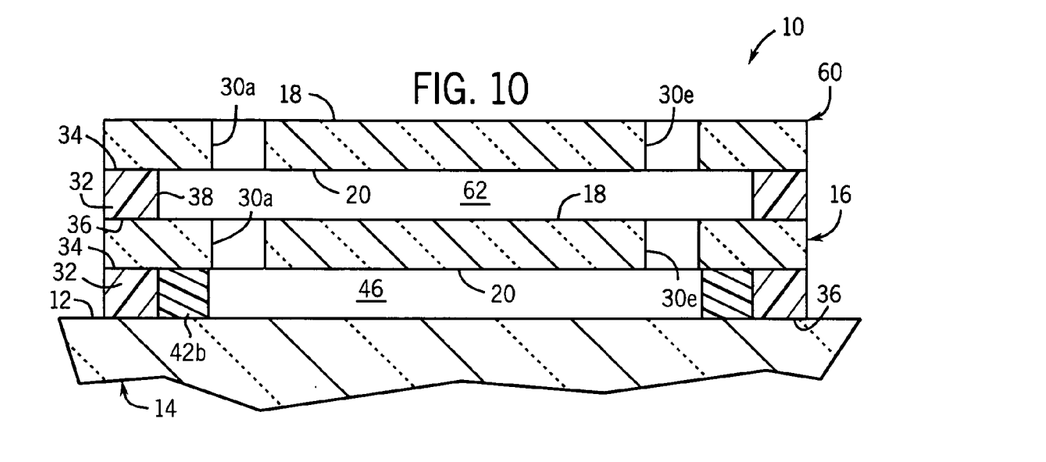
FIG. 10 is a cross-sectional view of the microfluidic device taken along line 10—10 of FIG. 9.
Figure 11:
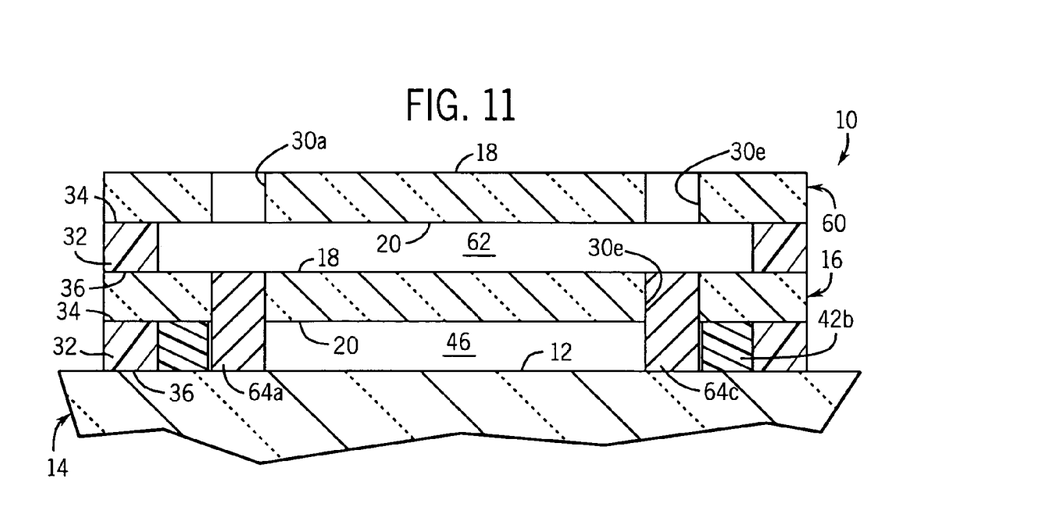
FIG. 11 is a cross-sectional view of the microfluidic device, similar to FIG. 10, showing plugs positioned within user selected openings in the microfluidic device.
Figure 12:
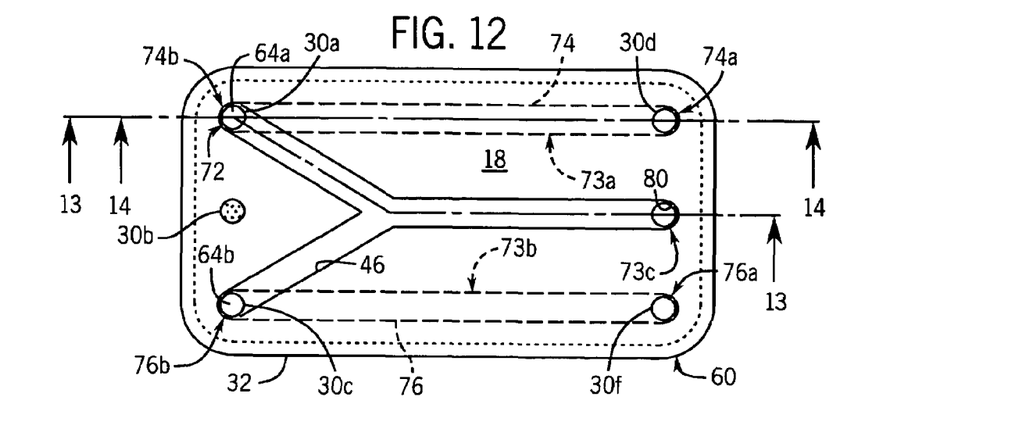
FIG. 12 is a top plan view of the microfluidic device of FIG. 11.

Referring to FIGS. 10–12, second layer 60 is positioned on first layer 16 such that inner surface 38 of gasket 32 of second layer 60, lower surface 20 of second layer 60 and upper surface 18 of first layer 16 define a cavity 62 for receiving additional polymerizable material 42, as hereinafter described. In addition, second layer 60 is positioned on upper surface 18 of first layer 16 such that openings 30a, 30c and 30e through second layer 60 are aligned with corresponding openings 30a, 30c, and 30e, respectively, through first layer 16.

Figure 13:
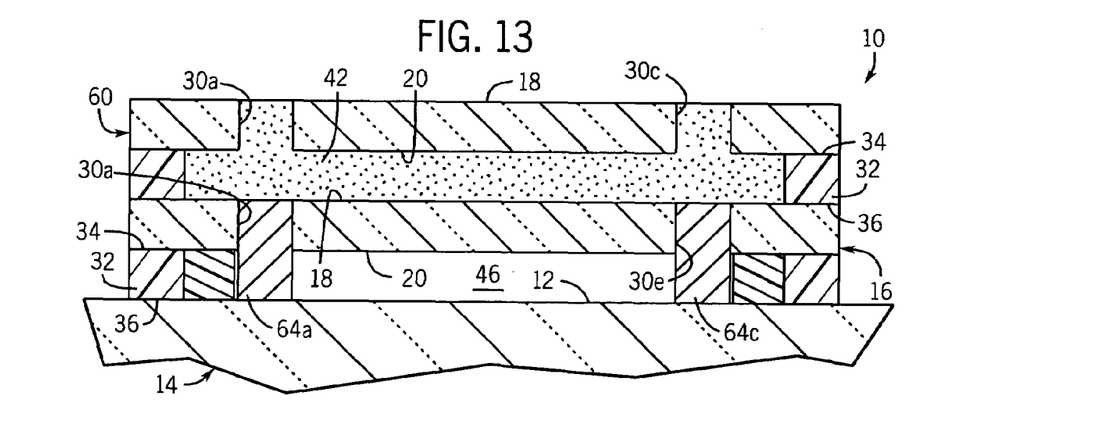
FIG. 13 is a cross-sectional view of the microfluidic device taken along line 13—13 of FIG. 12.
Figure 14:
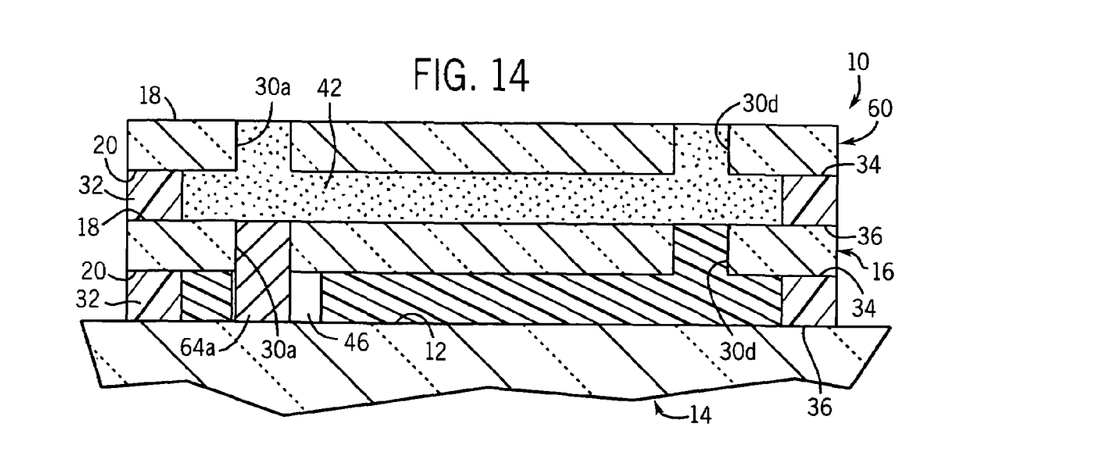
FIG. 14 is a cross-sectional view of the microfluidic device taken along line 14—14 of FIG. 12.

It is desired to provide a second channel network 72 in cavity 62 of microfluidic device 10, as hereinafter described, having a user desired configuration depicted in phantom in FIG. 12 and generally designated by the reference numerals 73a, 73b and 73c. It is intended that second channel network 72 include first and second generally parallel channels 74 and 76, respectively, and passageway 80 which communicates with opening 30c in second layer 60. In order to insure communication between channel network 46 and desired second channel network 72, a plurality of plugs 64a–c are inserted into microfluidic device 10. Plugs 64a–c may take the form of physical plugs, immiscible fluids, dissoluble solids or any other appropriate material. Plug 64a is inserted into opening 30a in first layer 16 and into channel network 46; plug 64b is inserted into opening 30c through first layer 16 and into channel network 46; and plug 64c is inserted into opening 30e in first layer 16 and into channel network 46. Thereafter, polymerizable material 42 is injected into cavity 62 through one or more of openings 30a–30f through second layer 60, FIG. 13. It can be appreciated that plugs 64a, 64b and 64c isolate channel network 46 and prevent material 42 from flowing therein.

Figure 15:
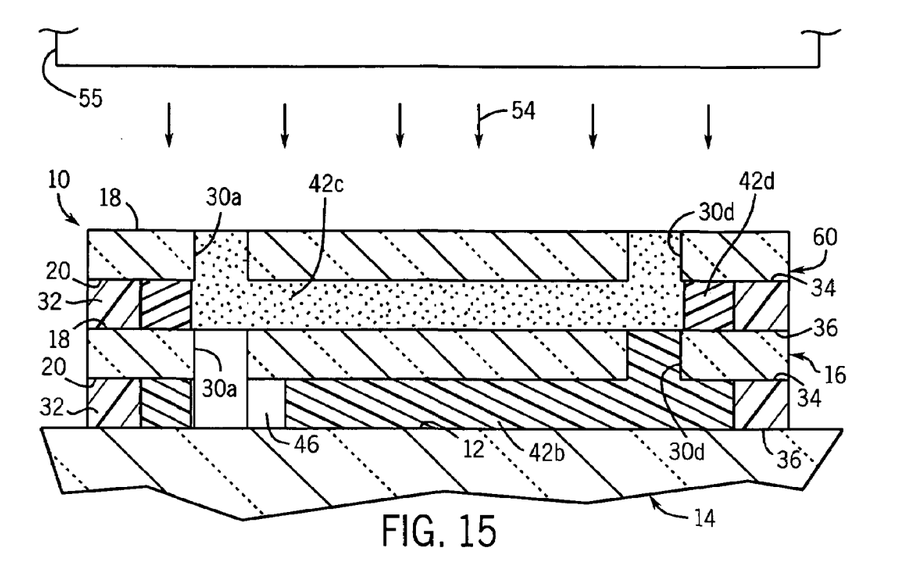
FIG. 15 is a cross-sectional view of the microfluidic device, similar to FIG. 14, showing the polymerization thereof.
Figure 16:
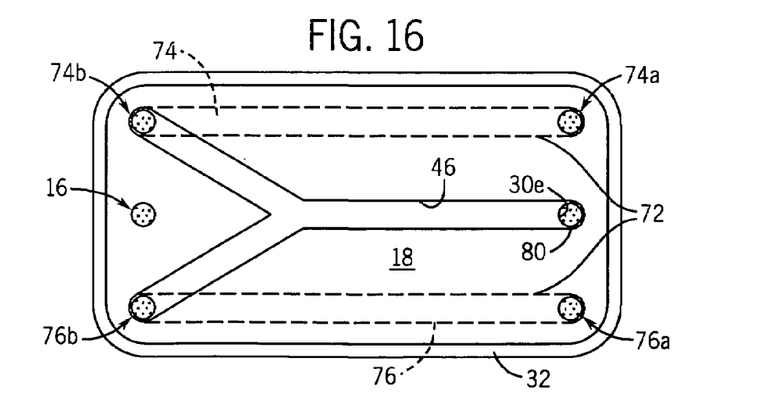
FIG. 16 is a top plan view of the microfluidic device of FIG. 15 showing the polymerization thereof.
Figure 17:
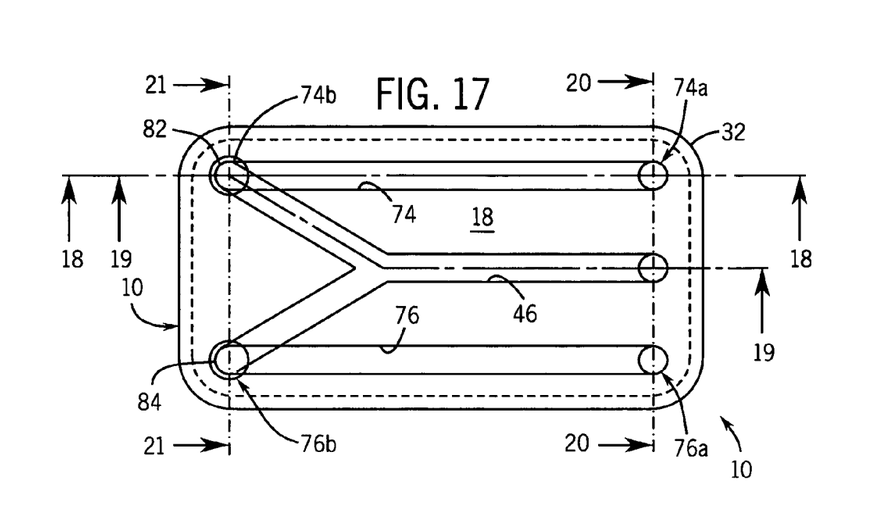
FIG. 17 is a top plan view of the microfluidic device.
Figure 18:
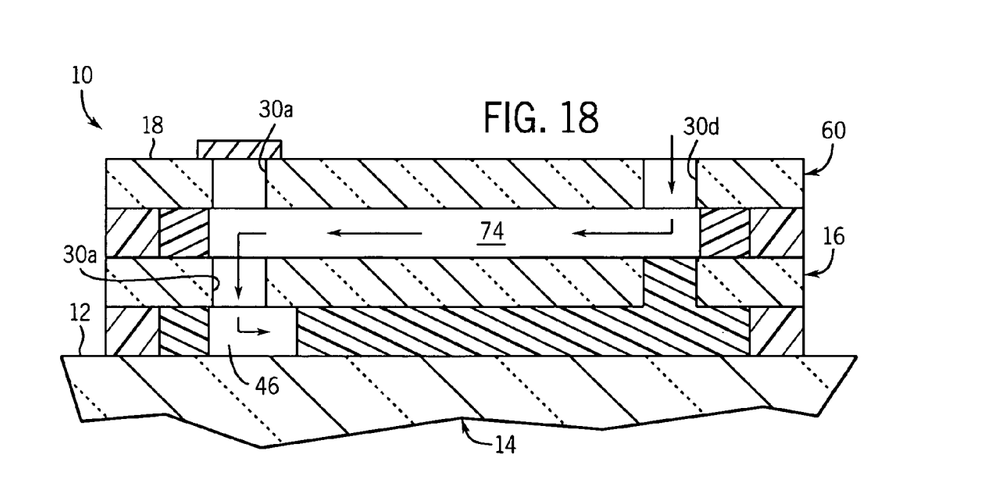
FIG. 18 is a cross-sectional view of the microfluidic device taken along line 18—18 of FIG. 17.

Referring to FIGS. 15 and 16, ultraviolet light, generally designated by the reference numbers 54, is generated by ultraviolet light projector 55 and is directed towards microfluidic device 10 at an angle generally perpendicular to upper surface 18 of second layer 60. As heretofore described, the polymerizable material 42 polymerizes and solidifies when exposed to ultraviolet light 54. It can be appreciated that ultraviolet light projector 55 may be programmed such that the ultratviolet light 54 generated thereby forms a pattern on upper surface 18 of second layer 60 wherein the portions 73a–73c of microfluidic device 10, depicted in phantom in FIGS. 12 and 16, are free of ultraviolet radiation such that a first portion 42c of the polymerizable material 42 is isolated from ultraviolet light 54 and wherein the entire portion of the microfluidic device 10 outside portions 73a–73c, depicted in phantom, are exposed to the ultraviolet radiation Such that a second portion 42d of material 42 is in the path of ultraviolet light 54. As a result, ultraviolet light 54 polymerizes and solidifies only second portion 42d of material 42 within cavity 62. Since first portion 42c of material 42 in cavity 62 is not exposed to ultraviolet light 54, first portion 42c is not polymerized and remains fluidic. Thereafter, as best seen in FIG. 17, the non-polymerized portion 42c of material 42 is flushed from second channel network 72 formed in microfluidic device 10. In addition, plugs 64a–c are removed from microfluidic device 10.

Referring to FIGS. 17–21, second channel network 72 includes first and second generally parallel channels 74 and 76, respectively, and passageway 80. First channel 74 of second channel network 72 has a first end 74a that communicates with opening 30d in second layer 60 such that opening 30d through second layer 60 defines a first input to microfluidic device 10, FIG. 18. Second end 70b of first channel 74 of second channel network 72 communicates with first channel network 46 through opening 30a in first layer 16. In addition, first channel 74 communicates with upper surface 18 of second layer 60 through opening 30a in second layer 60.

Figure 20:
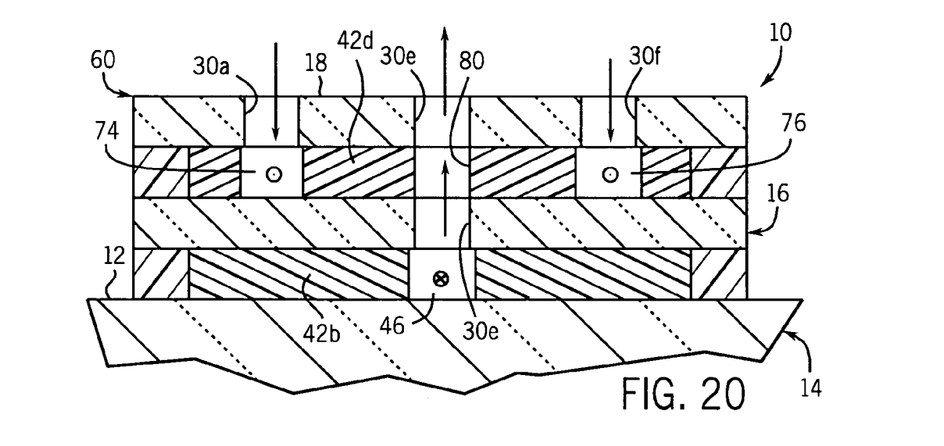
FIG. 20 is a cross-sectional view of the microfluidic device taken along line 20—20 of FIG. 17.
Figure 21:
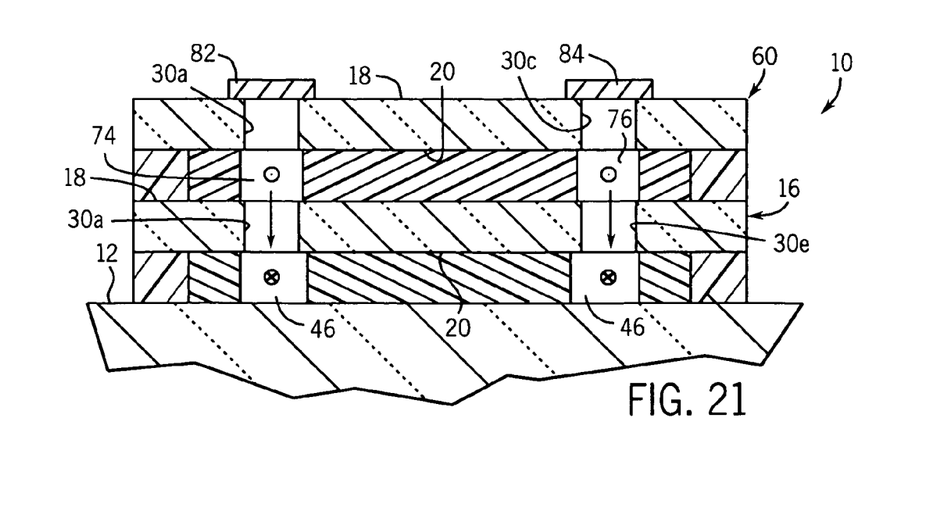
FIG. 21 is a cross-sectional view of the microfluidic device taken along line 21—21 of FIG. 17.

First end 76a of second channel 76 of second channel network 72 communicates with opening 30f through second layer 60 such that opening 30f defines a second input to microfluidic device 10, FIG. 20. Second end 76b of second channel 76 of second channel network 72 communicates with first channel network 46 through opening 30c through first layer 16, FIG. 21. In addition, second end 76b of second channel 76 of second channel network 72 communicates with upper surface 18 of second layer 60 through opening 30c in second layer 60, FIG. 21.

Figure 19:
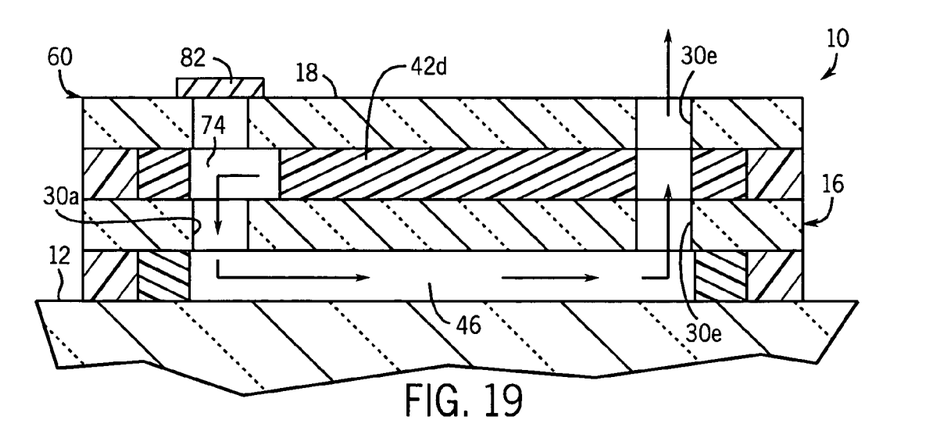
FIG. 19 is a cross-sectional view of the microfluidic device taken along line 19—19 of FIG. 17.

Referring to FIGS. 19 and 20, first channel network 46 also communicates with upper surface 18 of second layer 60 through: opening 30e through first layer 16; passageway 80 through polymerized portion 42d of material 42 within cavity 62; and cavity 30e through second layer 60 such that opening 30d through second layer 60 corresponds to an output for microfluidic device 10. It is contemplated to provide caps 82 and 84 on upper surface 18 of second layer 60 to close openings 30a and 30c, respectively, in second layer 60 so as to isolate first and second channel networks 46 and 72, respectively, from the environment external of microfluidic device 10.

As described, a sample fluid under pressure may be provided at inputs 30d and 30e of second layer 60 of microfluidic device 10. The sample fluid will flow through channels 74 and 76 of second channel network 72 and into first channel network 46 through corresponding openings 30a and 30c, respectively, in first layer 16. The sample fluid flow will continue to flow through channel network 16 and out of microfluidic device 10 through output 30e through second layer 60.

It can be appreciated that channel networks having different configurations may be fabricated within microfluidic device 10 using the method heretofore described by simply varying the portions of microfluidic device 10 to which ultraviolet light 54 is directed by ultraviolet light projector 55. Similarly, it can be appreciated that the method of the present invention may be used to fabricate individual elements, such as particle stops and filters, within the channel networks of a mircrofluidic device. In addition, it is contemplated as being within the scope of the present invention to provide microfluidic device 10 with additional layers and to form additional channel networks using the methodology heretofore described. No minimum or maximum limit as to the number of layers is contemplated. In such microfluidic devices having three or more layers, it can be appreciate that the channel networks formed by adjacent layers do not necessarily have to be in communication with each other. Further, it is contemplated to eliminate first layer 16 and base layer 14 and to fabricate mircofluidic device 10 from a collection of polymerizable material 42. In accordance with such method, ultraviolet light 54 is directed by ultraviolet light projector 55 towards user desired portions of material 42 in order to form the channel networks of a microfludic device.

Various modes of carrying out the invention are contemplated as being within the scope of the following claims particularly pointing out and distinctly claiming the subject matter that is regarded as the invention.

I claim:

1. A method of fabricating a microstructure, comprising the steps of:
   providing a base layer having an upper surface;
   providing a first layer having upper and lower surfaces and being in a spaced relationship to the upper surface of the base layer such that the lower surface of the first layer and the upper surface of the base layer define a construction cavity therebetween;
   filling the construction cavity with a material;
   utilizing an array of micromirrors to direct a polymerizing agent through the upper surface of the first layer and towards a portion of the material within the construction cavity such that the portion of the material within the construction cavity is polymerized; and
   flushing the non-polymerized material from the construction cavity.

2. The method of claim 1 wherein the first layer includes a fill hole therethrough for allowing for the filling of the construction cavity therethrough.

3. The method of claim 2 wherein the first layer has a passageway therethrough which communicates with the construction cavity and wherein the method further comprises the additional step of plugging the passageway in the first layer to prevent the material from flowing therein during filling.

4. The method of claim 2 comprising the additional steps of:
   providing a second layer having upper and lower surfaces and being in a spaced relationship to the first layer such that the lower surface of the second layer and the upper surface of the first layer define a second construction cavity therebetween;
   filling the second construction cavity with the material;
   utilizing the arrays of micromirrors to direct a polymerizing agent towards a portion of the material within the second construction cavity such that the portion of the material within the second construction cavity is polymerized; and
   flushing the non-polymerized material from the second construction cavity.

5. The method of claim 4 wherein:
   the first layer has a passageway therethrough which communicates with the construction cavity;
   the second layer has a passageway therethrough which communicates with the second construction cavity; and the passageway through the second layer and the passageway through the first layer are axially aligned and communicate with each other through the second construction cavity.

6. The method of claim 5 comprising the additional steps of:
  plugging the passageway in the first layer to prevent the material from flowing therein during the step of filling the second construction cavity with the material; and
  clearing the passageway in the first layer after the step of polymerizing a portion of the material within the second construction cavity.

7. The method of claim 6 wherein the passageway through the second layer communicates with the upper surface of the second layer through an opening and wherein the method further comprises the additional step of covering the opening.

8. The method of claim 4 wherein:
  the first layer has a passageway therethrough which communicates with the construction cavity and with the second construction cavity;
  the first layer includes a second passageway therethrough that communicates with the construction cavity;
  the passageway in the second layer communicates with the second construction cavity and with the upper surface of the second layer through a first opening; and
  the second layer includes a second passageway therethrough that communicates with the second passageway through the first layer and with the upper surface of the second layer through a second opening;
  wherein one of the openings in the second layer comprises an input and the other of the openings comprises an output.

9. The method of claim 1 further comprising the additional step of positioning a gasket about the construction cavity to maintain the material therein during filling.

10. A method of forming a microstructure, comprising the steps of:
  providing a base layer having an upper surface;
  providing a first layer having upper and lower surfaces and being in a spaced relationship to the upper surface of the base layer such that the lower surface of the first layer and the upper surface of the base layer define a first area therebetween;
  providing a material in the first area;
  utilizing an array of micromirrors to direct a polymerizing agent through the upper surface of the first layer towards a portion of the material within the first area so as to polymerize the same; and
  flushing the non-polymerized material from the first area.

11. The method of claim 10 wherein the step of utilizing the array of micromirrors to direct the polymerizing agent towards the portion of the material includes the steps of:
  generating ultraviolet radiation with a source; and
  directing the ultraviolet radiation towards the portion of material to be polymerized.

12. The method of claim 10 comprising the additional steps of:
  providing a second layer having upper and lower surfaces and being in a spaced relationship to the first layer such that the lower surface of the second layer and the upper surface of the first layer define a second area therebetween;
  filling the second area with the material; and
  utilizing the arrays of micromirrors to direct a polymerizing agent towards a portion of the material within the second area so as to polymerize the same.

13. The method of claim 12 comprising the additional steps:
  providing a first passageway through the first layer, the first passageway communicating with the first and second areas;
  providing a second passageway through the first layer, the second passageway communicating with the first area;
  providing a first passageway through the second layer, the first passageway through the second layer communicating with the second area and with the upper surface of the second layer through a first opening; and
  providing a second passageway through the second layer, the second passageway through the second layer communicating with the second passageway through the first layer and with the upper surface of the second layer through a second opening.

14. The method of claim 13 wherein one of the openings in the second layer comprises an input and the other of the openings comprises an output.

15. A method of constructing a microstructure, comprising the steps of:
  injecting a fluidic material into a construction cavity within the interior of a microfluidic device;
  utilizing an array of micromirrors to direct a polymerizing agent into the microfluidic device towards a portion of the fluidic material within the construction cavity so as to polymerize the same; and
  flushing the non-polymerized, fluidic material from the construction cavity.

16. The method of claim 15 wherein the microfluidic device defines a channel network and wherein the non-polymerized, fluidic material is flushed from the channel network.

17. The method of claim 16 wherein the step of utilizing the array of micrometers to direct the polymerizing agent towards the portion of the fluidic material includes the additional steps of:
  generating ultraviolet radiation with the source; and
  directing the ultraviolet radiation towards the portion of material to be polymerized.

18. The method of claim 17 wherein the ultraviolet radiation is ultraviolet light.

19. The method of claim 15 comprising the additional steps:
  injecting a fluidic material into a second construction cavity;
  utilizing an array of micromirrors to direct a polymerizing agent towards a portion of the fluidic material within the second construction cavity so as to polymerize the same; and
  flushing the non-polymerized, fluidic material from the second construction cavity.

* * * * *